(12) United States Patent
Kim et al.

(10) Patent No.: US 7,709,335 B2
(45) Date of Patent: May 4, 2010

(54) METHOD OF MANUFACTURING SEMICONDUCTOR DEVICE INCLUDING ISOLATION PROCESS

(75) Inventors: Yong-il Kim, Hwaseong-si (KR); Hyeong-sun Hong, Seongnam-si (KR); Makoto Yoshida, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 12/213,174

(22) Filed: Jun. 16, 2008

(65) Prior Publication Data
US 2009/0181510 A1 Jul. 16, 2009

(30) Foreign Application Priority Data
Jan. 15, 2008 (KR) .................. 10-2008-0004433

(51) Int. Cl.
*H01L 21/336* (2006.01)
(52) U.S. Cl. .................. 438/294; 438/435; 438/257; 438/424; 438/314
(58) Field of Classification Search .......... 438/294, 438/257, 259, 314
See application file for complete search history.

(56) References Cited

U.S. PATENT DOCUMENTS

| | | | | |
|---|---|---|---|---|
| 6,228,713 B1 * | 5/2001 | Pradeep et al. | ............... | 438/257 |
| 6,987,047 B2 * | 1/2006 | Iguchi et al. | ................. | 438/257 |
| 7,132,331 B2 * | 11/2006 | Jang et al. | ................... | 438/259 |

FOREIGN PATENT DOCUMENTS

| | | |
|---|---|---|
| JP | 2003-197731 | 7/2003 |
| KR | 100672162 | 1/2007 |
| KR | 1020070003337 | 1/2007 |

* cited by examiner

*Primary Examiner*—Matthew Smith
*Assistant Examiner*—Wilner Jean Baptiste
(74) *Attorney, Agent, or Firm*—Harness, Dickey & Pierce, P.L.C.

(57) ABSTRACT

Provided may be a method of manufacturing a semiconductor device. The method may include forming a plurality of isolation patterns including conductive patterns on a semiconductor substrate and forming gaps between the isolation patterns, forming active patterns filling the gaps on the semiconductor substrate, forming a gate insulation layer on the isolation patterns and the active patterns, and forming gate patterns on the gate insulation layer.

20 Claims, 14 Drawing Sheets

METHOD OF MANUFACTURING SEMICONDUCTOR DEVICE INCLUDING ISOLATION PROCESS

PRIORITY STATEMENT

This application claims priority under 35 U.S.C. § 119 to Korean Patent Application No. 10-2008-0004433, filed on Jan. 15, 2008, in the Korean Intellectual Property Office (KIPO), the entire contents of which are incorporated herein by reference.

BACKGROUND

1. Field

Example embodiments relate to a method of manufacturing a semiconductor device, and more particularly, to a method of manufacturing a semiconductor device including an isolation process.

2. Description of the Related Art

In general, unit transistors, e.g., unit cells, of a semiconductor device may be electrically insulated using an isolation layer. The isolation layer may include a field oxidization layer formed by selectively oxidizing a semiconductor substrate, for example, a silicon substrate, using Local oxidation of silicon (LOCOS) or a trench isolation layer formed by filling an isolation layer in a trench prepared by etching a semiconductor substrate to a fixed depth.

The field oxidization layer may be undesirable in terms of integration, and thus, may not be used as semiconductor devices are highly integrated devices. Instead, the trench isolation layer may be used in most cases. Because the trench isolation layer is formed on the trench prepared by etching a semiconductor substrate to a fixed depth, a semiconductor device may be highly integrated in one plane.

However, in the trench isolation layer, a depth of the trench may be larger for insulation between unit cells and a width (breadth or diameter) of the trench may be smaller to allow for higher integration. In particular, if a depth of the trench is not large, the unit cells may not be electrically insulated. An insulation layer may be filled in the trench when the trench insulation layer is formed. However, when a depth of the trench is larger and a width of the trench is smaller, the insulation layer may not be properly filled in the trench. When the insulation layer is not properly filled in the trench, the unit cells may not be electrically insulated.

SUMMARY

Example embodiments provide a method of manufacturing a semiconductor device in which an isolation pattern which electrically insulates unit cells may be formed without using a trench process for etching a semiconductor substrate.

According to example embodiments, there is provided a method of manufacturing a semiconductor device. The method may include forming a plurality of isolation patterns including conductive patterns on a semiconductor substrate. Gaps between the isolation patterns may be formed and active patterns filling the gaps on the semiconductor substrate may be formed. A gate insulation layer may be formed on the isolation patterns and the active patterns. Gate patterns may be formed on the gate insulation layer.

Forming the plurality of isolation patterns may include forming first insulation patterns on the semiconductor substrate, forming the conductive patterns on the first insulation patterns, and forming second insulation patterns on both sidewalls of the conductive patterns. The conductive patterns may be surrounded by the first insulation patterns, the second insulation patterns, and the gate insulation layer.

Forming the plurality of isolation patterns may include forming a first insulation layer on the semiconductor substrate, forming the conductive patterns on the first insulation layer, forming the gaps between the conductive patterns, forming a second insulation layer on the semiconductor substrate and the gaps to surround the conductive patterns, forming first insulation patterns and the conductive patterns on the semiconductor substrate, and forming second insulation patterns on both sidewalls of the conductive patterns by etching the second insulation layer and the first insulation layer. Etching the second insulation layer and the first insulation layer may include etching back the second insulation layer and the first insulation layer to expose the surfaces of the conductive patterns and the semiconductor substrate.

Forming the plurality of isolation patterns may include forming a first insulation layer on the semiconductor substrate, forming a plurality of first conductive patterns on the first insulation layer, forming a plurality of second conductive patterns between the plurality of first conductive patterns, forming second insulation patterns between the plurality of first conductive patterns and the plurality of second conductive patterns, forming first insulation patterns and the plurality of first or second conductive patterns on the semiconductor substrate by etching the second insulation patterns and the first insulation layer, forming a second insulation layer on the semiconductor substrate to surround the plurality of first conductive patterns and the plurality of second conductive patterns, forming the first insulation patterns and the plurality of first and second conductive patterns on the semiconductor substrate, and forming second insulation patterns on both sidewalls of the plurality of first and second conductive patterns by etching the third insulation layer.

Forming the first insulation patterns and the second insulation patterns includes etching back the second insulation layer so as to expose the surfaces of the first conductive patterns and the semiconductor substrate. Forming the plurality of first conductive patterns, the plurality of second conductive patterns, and the second insulation patterns may include forming a third insulation layer on the semiconductor substrate to surround the plurality of first conductive patterns, forming a plurality of third insulation patterns on both sidewalls of the first conductive patterns by etching back the third insulation layer so as to expose the surfaces of the first conductive patterns, forming a second conductive layer on the first insulation layer filling gaps between the third insulation patterns, and forming the third insulation patterns by etching back the second conductive layer so as to expose the surfaces of the first conductive patterns and the third insulation patterns.

The method may further include isolating the active patterns by forming holes, and forming second isolation patterns in the holes to insulate the active patterns. The active patterns may be arranged in a line or freely arranged according to the arrangements of the holes and the second isolation patterns. The active patterns may fill the gaps using a selective epitaxial growth process. The conductive patterns may be formed of at least one of a poly silicon layer doped with impurities, a titanium nitride (TiN) layer, and a tungsten (W) layer and the active patterns are formed of a silicon layer.

Forming the plurality of isolation patterns may include forming the conductive patterns and insulation patterns in one direction, the conductive patterns applying bias to the semiconductor substrate and the insulation patterns surrounding and isolating the conductive patterns, and the gate patterns are formed in another direction perpendicular to the one direction on the gate insulation layer, and the method may further include forming source/drain regions on the active patterns in the other direction.

The one direction may be a direction of a channel width and the other direction is a direction of a channel length. Forming the insulation patterns may include forming first insulation patterns on the semiconductor substrate and second insulation patterns on both sidewalls of the conductive patterns.

The method may include isolating the active patterns in the other direction by forming holes, and forming second isolation patterns in the holes to insulate the active patterns. The holes isolating the active patterns in the other direction may be formed to extend in the one direction so that the active patterns are arranged in a line. The holes isolating the active patterns in the other direction may be formed to be freely arranged in the active patterns.

Before forming the plurality of isolation patterns, the method may further include forming a first insulation layer on the semiconductor substrate, forming a plurality of conductive patterns capable of applying bias to the first insulation layer in one direction and forming gaps between the conductive patterns, forming a second insulation layer on the first insulation layer and in the gaps to surround the conductive patterns, wherein forming the plurality of isolation patterns on the semiconductor substrate may include forming first insulation patterns, the plurality of conductive patterns and second insulation patterns on both sidewalls of the plurality of conductive patterns by etching the first and second insulation layers, and wherein forming the gate patterns on the gate insulation layer may include forming gate patterns in another direction perpendicular to the one direction.

The method may further include forming source/drain regions on the active patterns on both sides of lower portions of the gate patterns in the other direction, wherein the conductive patterns are formed of materials having high etching selectivity, compared with those of the first and second insulation layers.

BRIEF DESCRIPTION OF THE DRAWINGS

Example embodiments will be more clearly understood from the following detailed description taken in conjunction with the accompanying drawings.

FIGS. 1-7 are perspective views for illustrating a method of manufacturing a semiconductor device including an isolation process, according to example embodiments;

FIG. 8 is a partial plane view of FIG. 7;

FIGS. 9-16 are perspective views for illustrating a method of manufacturing a semiconductor device including an isolation process, according to example embodiments;

FIGS. 17-22 are perspective views for illustrating a method of manufacturing a semiconductor device including an isolation process, according to example embodiments;

FIG. 23 is a partially enlarged plane view of FIG. 22;

FIGS. 24-28 are perspective views for illustrating a method of manufacturing a semiconductor device including an isolation process, according to example embodiments; and FIG. 29 is partially enlarged plane view of FIG. 28.

Figure 1:
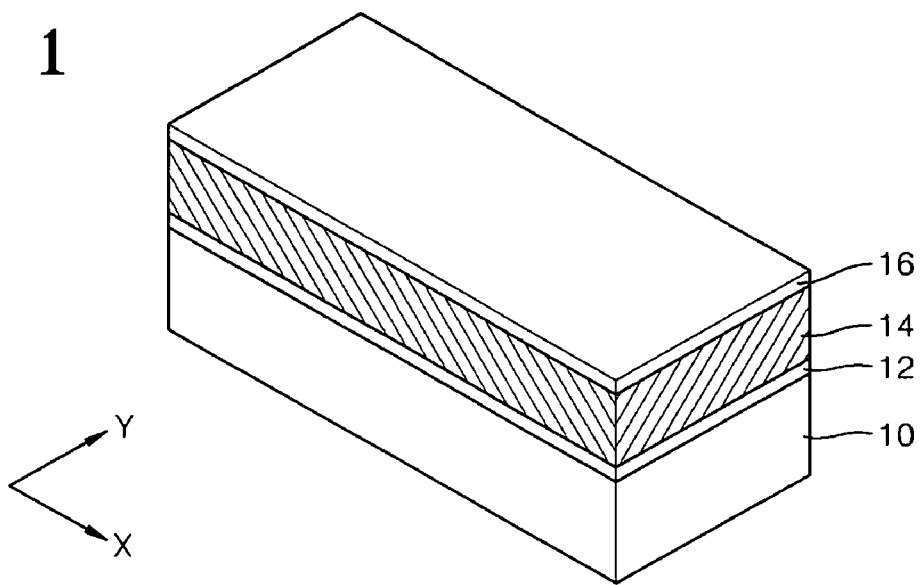
FIGS. 1-29 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described more fully with reference to the accompanying drawings, in which example embodiments are shown. Example embodiments may, however, be embodied in many different forms and should not be construed as being limited to the embodiments set forth herein; rather, these embodiments may be provided so that this disclosure will be thorough and complete, and will fully convey the concept of example embodiments to those skilled in the art. Example embodiments may be embodied using an embodiment set forth herein or using combination of embodiments. Example embodiments may be applied to a memory semiconductor device or non-memory semiconductor device.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 5:
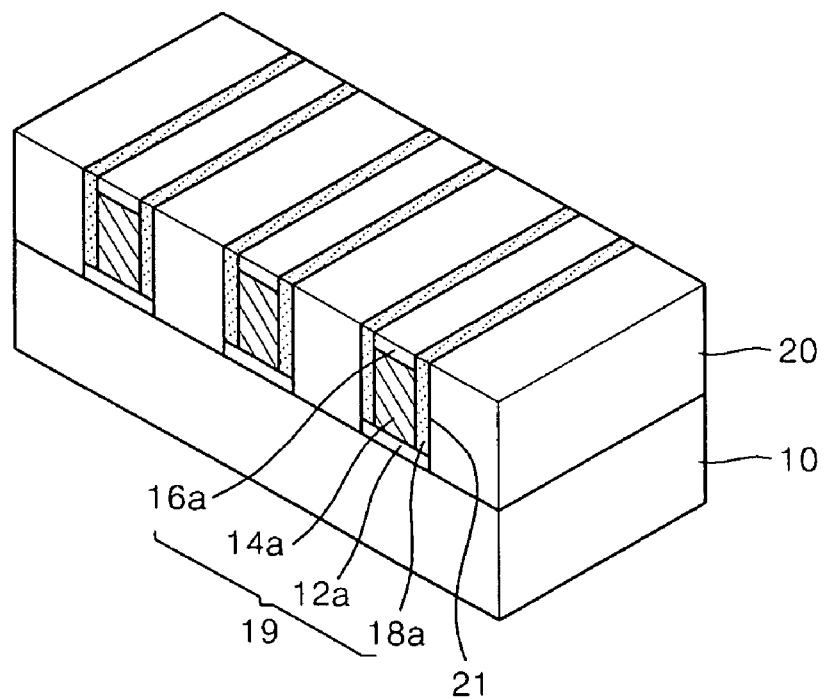
Figure 6:
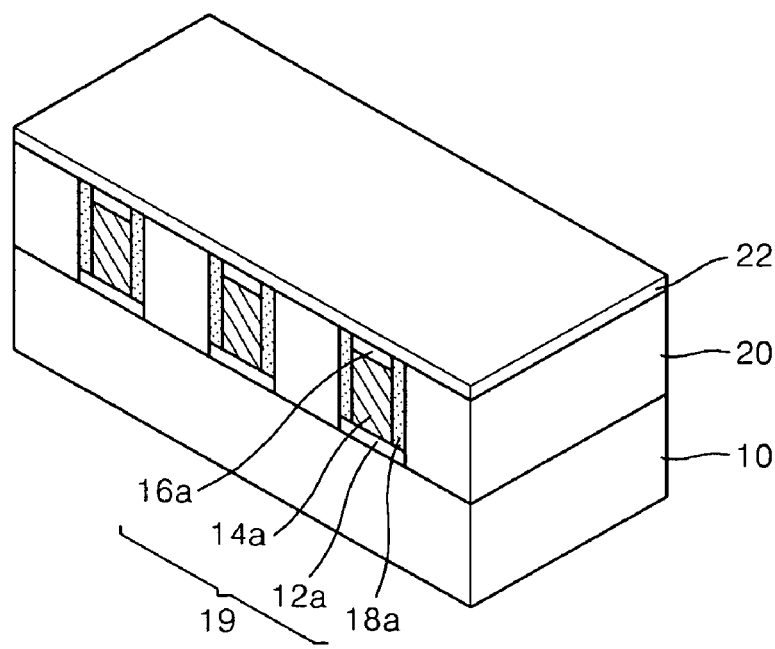
Figure 7:
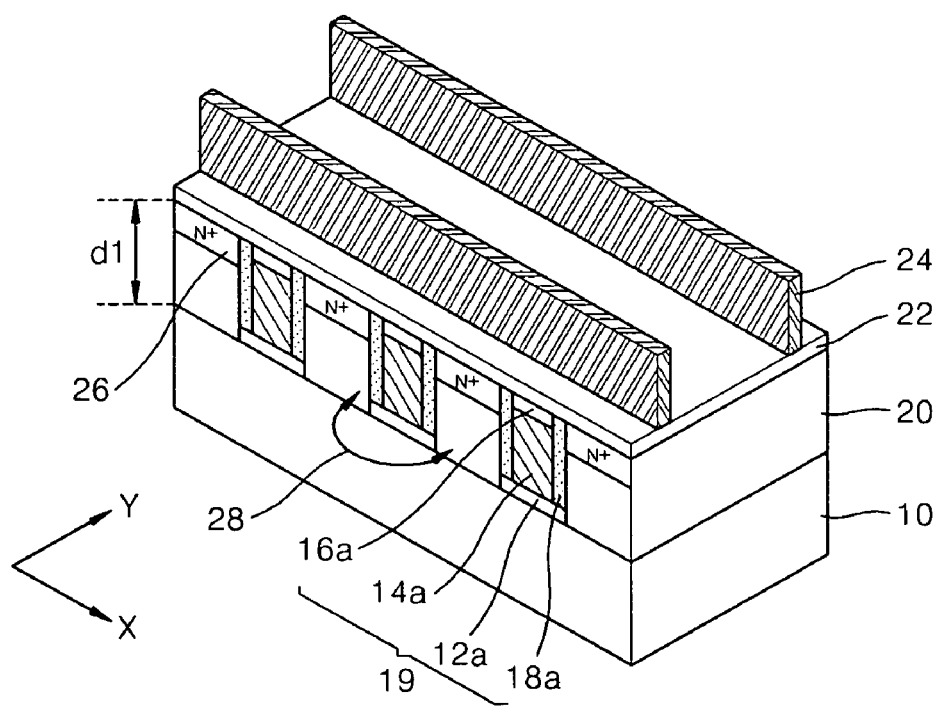
Figure 8:
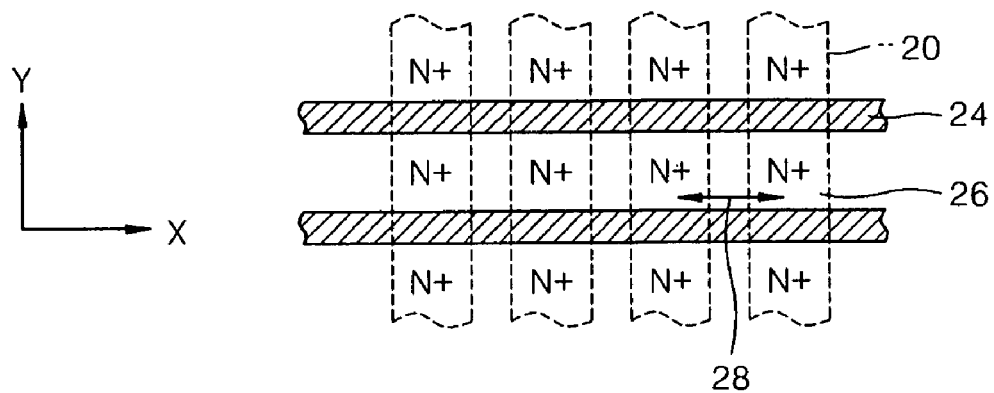

FIGS. 1-7 are perspective views for illustrating a method of manufacturing a semiconductor device including an isolation process, according to example embodiments and FIG. 8 is a partial plane view of FIG. 7. Referring to FIG. 1, a first insulation layer 12, a conductive layer 14, and a mask layer 16 may be sequentially formed on a semiconductor substrate 10, for example, a silicon substrate. A p-type silicon substrate may be used as the semiconductor substrate 10. A silicon oxide layer ($SiO_2$) may be used as the first insulation layer 12. The conductive layer 14 may be a layer to which a bias may be applied during normal operation of the semiconductor device. The conductive layer 14 may be formed of a material having higher etching selectivity to the first insulation layer and a second insulation layer, for example, a silicon oxide layer.

The conductive layer 14 may include a poly silicon layer doped with impurities, a titanium nitride (TiN) layer, or a tungsten (W) layer. A nitride layer (SiN) may be used as the mask layer 16. In FIG. 1, an X-direction denotes a direction of a channel width of the semiconductor device and a Y-direction denotes a direction of a channel length of the semiconductor device. In subsequent drawings, the X and Y directions are not illustrated.

Figure 2:
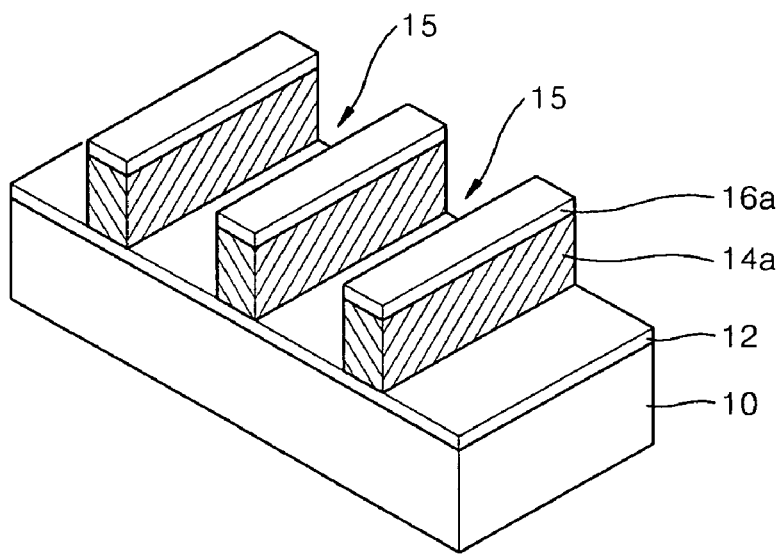

Referring to FIG. 2, the mask layer 16 may be patterned using photo etching so as to form mask patterns 16a. The conductive layer 14 may be etched using the mask patterns 16a as an etching mask so as to form a plurality of conductive patterns 14a and form first gaps 15 between the conductive patterns 14a. The conductive patterns 14a may be formed in one direction, for example, the X-axis direction. One of the conductive patterns 14a may extend in the Y-axis direction. In example embodiments, the conductive patterns 14a may be formed using the mask patterns 16a. However, the conductive layer 14 may be directly patterned using photo etching without using the mask patterns 16a.

Figure 3:
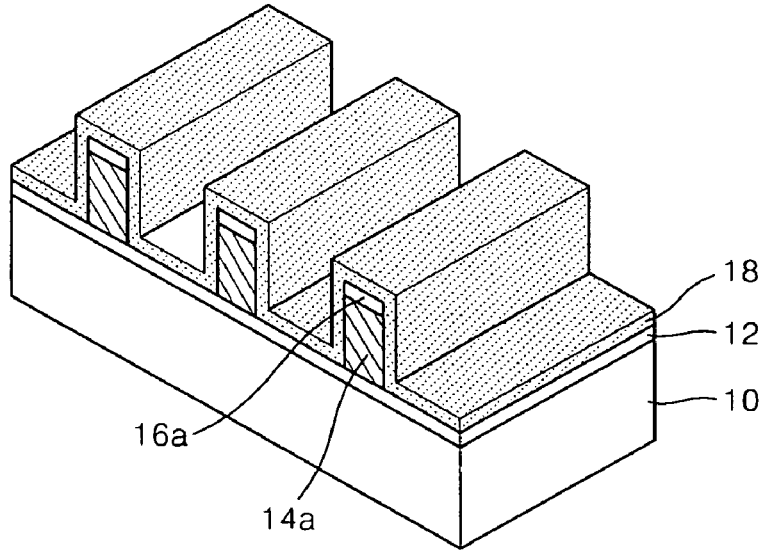

Referring to FIG. 3, a second insulation layer 18 may be formed on the first insulation layer 12 and the first gaps 15 to cover the conductive patterns 14a and the mask patterns 16a. The second insulation layer 18 may be formed on both sidewalls of the conductive patterns 14a, the surfaces of the mask patterns 16a, and the first insulation layer 12. The second insulation layer 18 may be formed of a silicon oxide layer.

Figure 4:
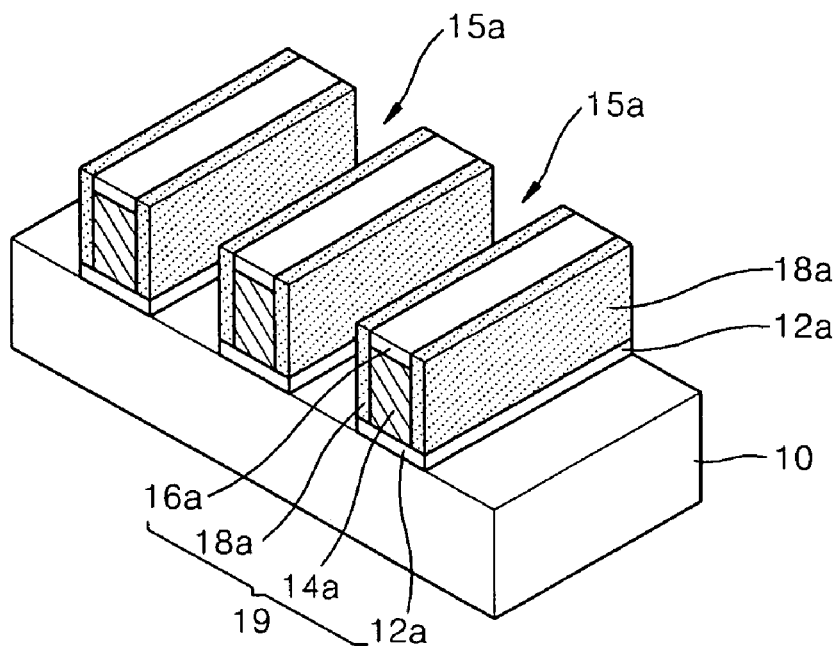

Referring to FIG. 4, the second insulation layer 18 and the first insulation layer 12 may be etched. For example, the second insulation layer 18 and the first insulation layer 12 may be etched back to expose the surfaces of the mask patterns 16a and the semiconductor substrate 10. The conductive patterns 14a and the mask patterns 16a may be formed on first insulation patterns 12a disposed on the semiconductor substrate 10, second insulation patterns 18a may be formed on both sidewalls of the conductive patterns 14a and the mask patterns 16a, and second gaps 15a may be formed between the patterns.

The first insulation patterns 12a formed on the semiconductor substrate 10, the conductive patterns 14a and the mask patterns 16a formed on the first insulation patterns 12a, and the second insulation patterns 18a formed on both sidewalls of the conductive patterns 14a and the mask patterns 16a may isolate unit cells of the semiconductor device, and thus, may be referred to as an isolation pattern 19. The isolation pattern 19 may be commonly referred to as an isolation layer. However, in example embodiments, such an isolation layer may be formed in a pattern and thus the term 'pattern' may be used. A plurality of the isolation patterns 19 may be formed in one direction, e.g., the X-axis direction, and the second gaps 15a may be formed between the isolation patterns 19.

The conductive patterns 14a formed of the isolation pattern 19 may be surrounded by insulation materials, for example, the first insulation patterns 12a, the second insulation patterns 18a, and the mask patterns 16a, and may be insulated. When the mask patterns 16a are not formed, the conductive patterns 14a formed of the isolation pattern 19 may be surrounded by insulation materials, for example, the first insulation pattern 12a, the second insulation patterns 18a, and a gate insulation layer which will be formed later, and may be insulated.

Referring to FIG. 5, active patterns 20 filled with the gaps 15 and 15a may be formed on the semiconductor substrate 10. The active patterns 20 may be formed of a silicon layer by a selective epitaxial growth process. The surfaces of the active patterns 20 may be formed to correspond to those of the mask patterns 16a. Accordingly, in example embodiments, the gaps 15a may be formed by a selective epitaxial growth process, and thus, a process of filling the trench formed by etching a semiconductor substrate may not be used. Thus, isolation may be more easily accomplished in the semiconductor device having a higher aspect ratio.

Referring to FIGS. 6 and 7, a gate insulation layer 22 may be formed on isolation patterns 19 and the active patterns 20. The gate insulation layer 22 may be formed on the front surfaces of the isolation patterns 19 and the active patterns 20. The gate insulation layer 22 may be a silicon oxide layer. A plurality of gate patterns 24, for example, gate electrodes, may be formed on the gate insulation layer 22. The gate patterns 24 may be formed in the other direction perpendicular to the one direction described above, for example, the Y-axis direction. Source/drain regions 26 may be formed on the active patterns 20 disposed on both sides of lower portions of the gate patterns 24 in the Y-axis direction. In FIG. 7, the semiconductor substrate 10 may be formed of a p-type silicon substrate, and thus, the source/drain regions 26 may be illustrated as N+ impurities regions.

Referring back to FIGS. 7 and 8, the semiconductor device according to example embodiments may apply bias, for example, negative bias, to the conductive patterns 14a included in the isolation patterns 19. When the semiconductor device applies bias to the conductive patterns 14a, electricity may be prevented or reduced from flowing between the unit cells in the X-axis direction, e.g., a channel width direction, as marked with reference numeral 28, and thus, isolation properties may be improved. As isolation properties improve, the isolation patterns 19 of the semiconductor device according to example embodiments may have a reduced depth d1 or a reduced width (diameter).

FIGS. 9-16 are perspective views for illustrating a method of manufacturing a semiconductor device including an isolation process, according to example embodiments. The method of manufacturing a semiconductor device according to FIGS. 9-16 may be the same as that of FIGS. 1-7 in terms of the structure and the function, except that forming the isolation patterns 19 illustrated in FIG. 4 may be different. In example embodiments, the isolation patterns 19 may be formed using self-align double patterning. In FIGS. 9-16, like reference numerals in FIGS. 1 through 4 denote like elements.

Figure 9:
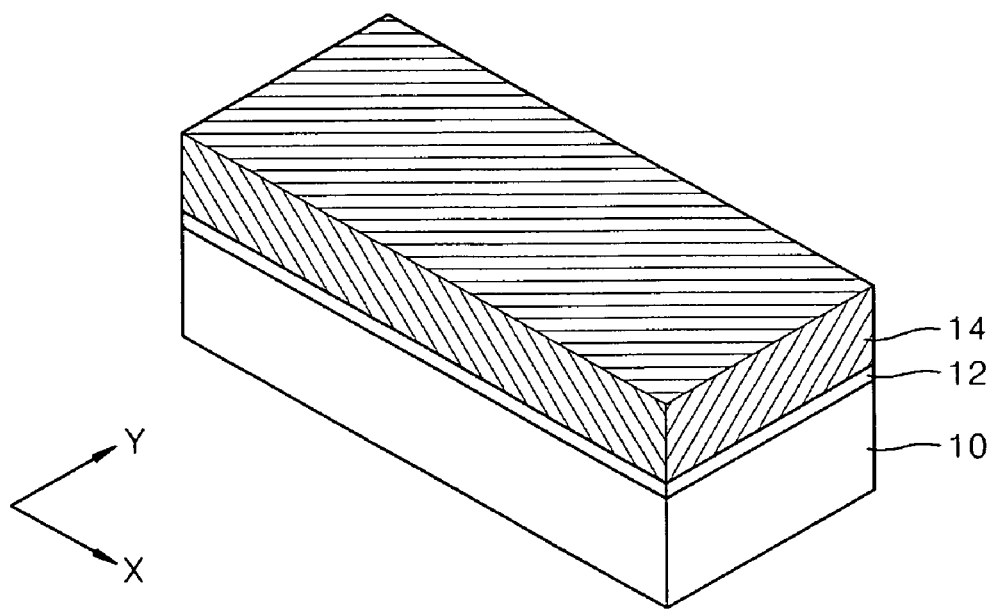

Referring to FIG. 9, the first insulation layer 12 and the first conductive layer 14 may be formed on the semiconductor substrate 10, for example, a silicon substrate. The semiconductor substrate 10 may be a p-type silicon substrate. The first insulation layer 12 and the first conductive layer 14 have been described in other example embodiments, and thus, detailed descriptions thereof may be omitted. In FIG. 9, an X-direction denotes a direction of a channel width of the semiconductor device and a Y-direction denotes a direction of a channel length of the semiconductor device. In subsequent drawings, the X and Y directions may not be illustrated.

Figure 10:
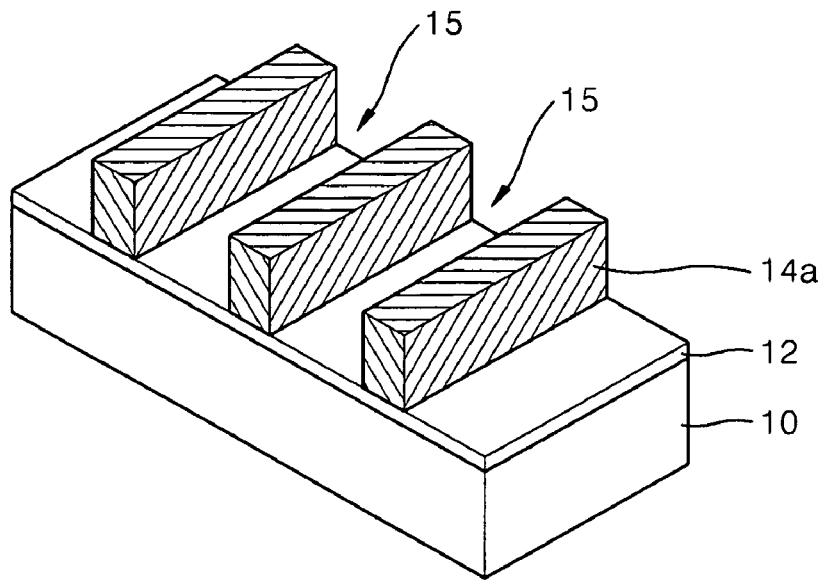
Figure 11:
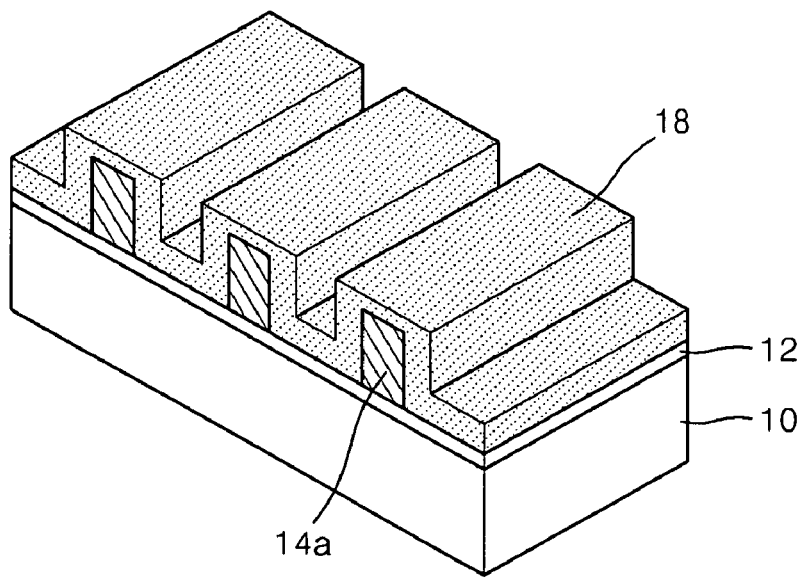

Referring to FIGS. 10 and 11, the first conductive layer 14 may be patterned using photo etching so as to form a plurality of first conductive patterns 14a on the first insulation layer 12 and form the gaps 15 between the first conductive patterns 14a. The first conductive patterns 14a may be formed in one direction, for example, the X-axis direction. The second insulation layer 18 may be formed on the first insulation layer 12 and the gaps 15 to cover the first conductive patterns 14a. The second insulation layer 18 may be formed on both sidewalls of the first conductive patterns 14a and the first insulation layer 12.

Figure 12:
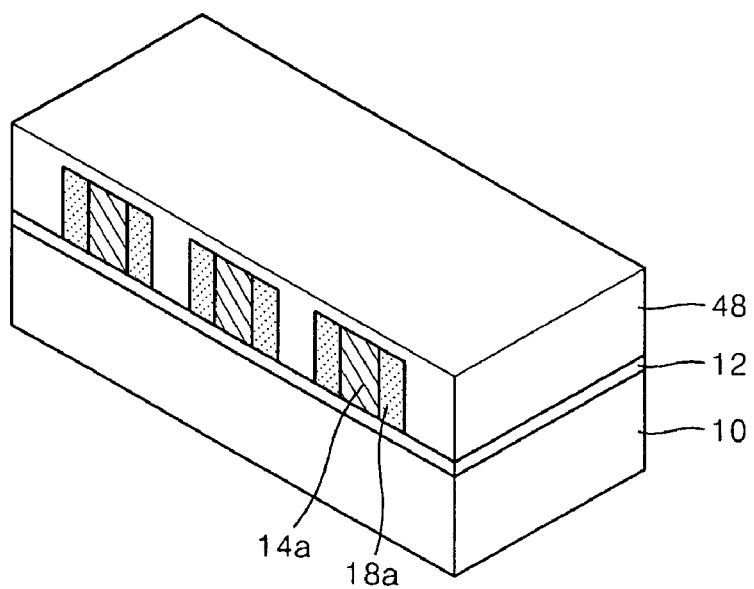

Referring to FIG. 12, the second insulation layer 18 may be etched. For example, the second insulation layer 18 may be etched back to expose the surfaces of the first conductive patterns 14a so as to form a plurality of the second insulation patterns 18a on both sidewalls of the first conductive patterns 14a. A second conductive layer 48 may be formed on the first insulation layer 12 by filling the gaps between the second insulation patterns 18a. The second conductive layer 48 may be formed to completely cover the first conductive patterns 14a and the second insulation patterns 18a on the first insulation layer 12. The second conductive layer 48 may be formed of the same material layer as that of the first conductive layer 14 and the function of the second conductive layer 48 may also be the same as those of the first conductive layer 14.

Figure 13:
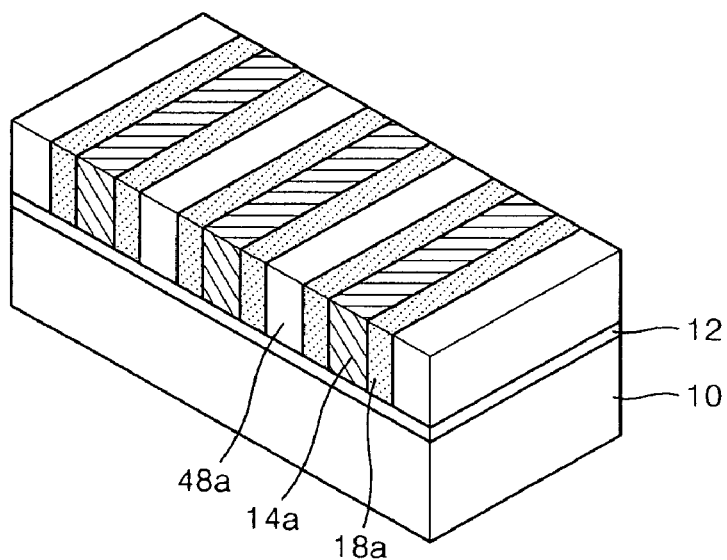

Referring to FIG. 13, the second conductive layer 48 may be etched. For example, the second conductive layer 48 may be etched back to expose the surfaces of the first conductive patterns 14a and the second insulation patterns 18a so as to form second conductive patterns 48a. The second conductive patterns 48a may be self-aligned to the second insulation patterns 18a and may be formed on the first insulation layer 12.

Accordingly, on the first insulation layer 12 of the semiconductor substrate 10, the plurality of the first conductive patterns 14a may be formed, the plurality of the second conductive patterns 48a may be formed between pairs of the first conductive patterns 14a, and the second insulation patterns 18a may be formed between the first conductive patterns 14a and the second conductive patterns 48a. Consequently, the second conductive patterns 48a formed between the first conductive patterns 14a using self-aligning may overcome a limit of photo process resolution and may be minutely formed.

Figure 14:
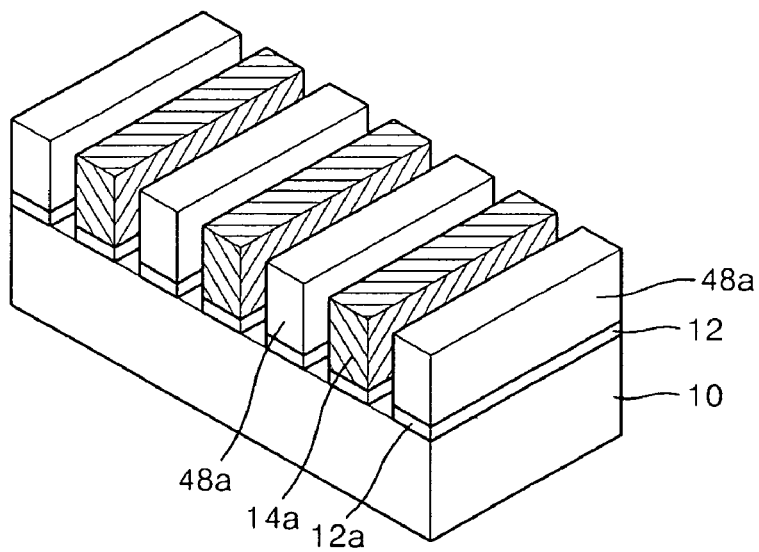

Referring to FIG. 14, the second insulation patterns 18a and the first insulation layer 12 disposed on the lower portion of the second insulation patterns 18a may be etched to form the first insulation patterns 12a on the semiconductor substrate and the first or second conductive patterns 14a or 48a on the surfaces of the first insulation patterns 12a. In other words, the second insulation patterns 18a may be removed and the first insulation layer 12 disposed on the lower surface of the second insulation patterns 18a may be etched. The first insulation patterns 12a and the first or second conductive patterns 14a or 48a disposed on the surfaces of the first insulation patterns 12a may be formed.

In example embodiments, as the second conductive patterns 48a are formed between the first conductive patterns 14a through the self-align double patterning process, a resolution limit of photo process may be overcome. In example embodiments, a self-align double patterning may be used so that the insulation patters may be formed between the conductive patterns, and then, the insulation patterns may be removed in FIGS. 9-14. However, forming the insulation patterns and then forming the conductive patterns between the insulation patterns may also be possible.

Figure 15:
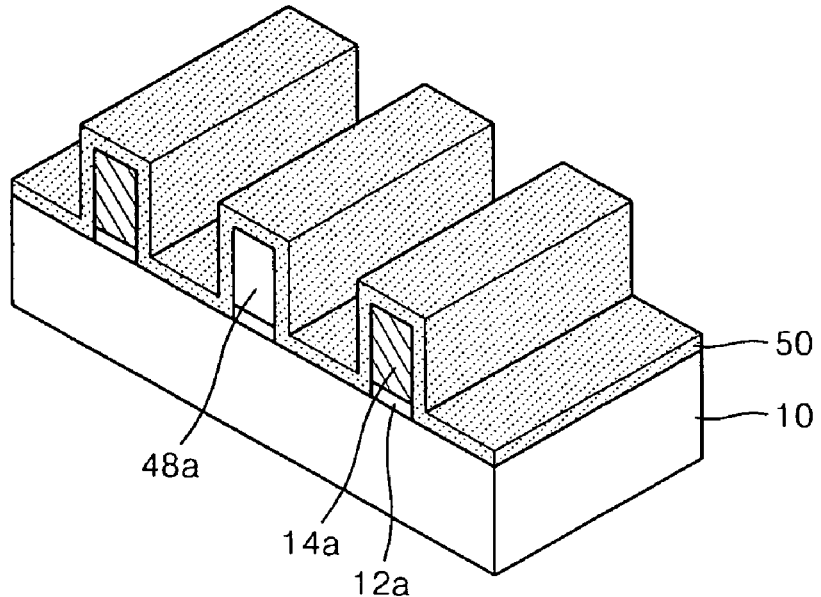
Figure 16:
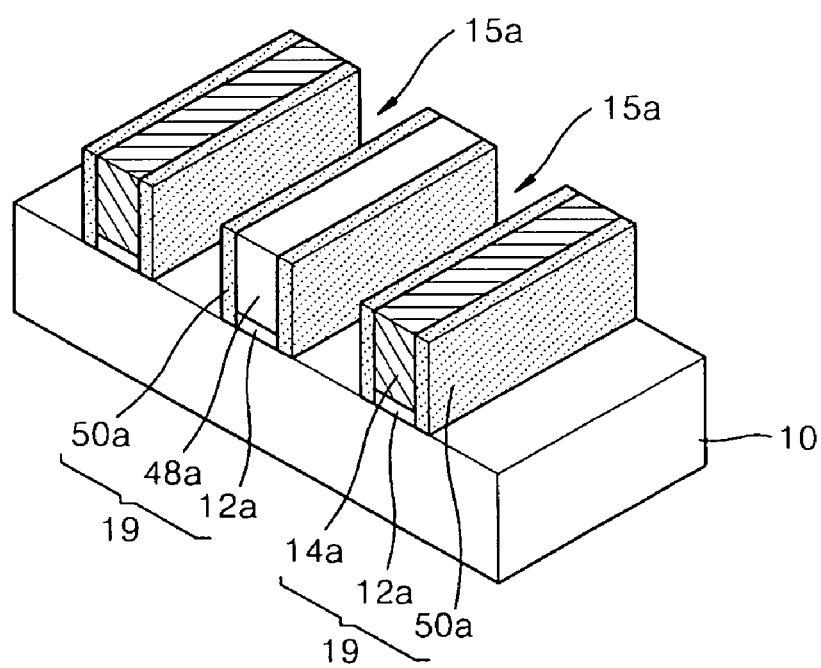

Referring to FIGS. 15 and 16, only three conductive patterns of FIG. 14 may be enlarged in FIG. 15 for convenience. A third insulation layer 50 may be formed on the semiconductor substrate 10 to cover the first conductive patterns 14a and the second conductive patterns 48a. The third insulation layer 50 may be formed of an oxidization layer. The third insulation layer 50 may be etched. For example, the third insulation layer 50 may be etched back to expose the surfaces of the first conductive patterns 14a, the second conductive patterns 48a, and the semiconductor substrate 10.

Accordingly, the conductive patterns 14a and 48a may be formed on the first insulation patterns 12a disposed on the semiconductor substrate 10, third insulation patterns 50a may be formed on both sidewalls of the conductive patterns 14a and 48a, and the gaps 15a may be formed between the patterns. Consequently, in the semiconductor device according to example embodiments, the isolation patterns 19 may be formed of the first insulation patterns 12a, the conductive patterns 14a and 48a, and the third insulation patterns 50a. Manufacture of the semiconductor device may be completed using the manufacturing process as in FIGS. 5-7.

Figure 20:
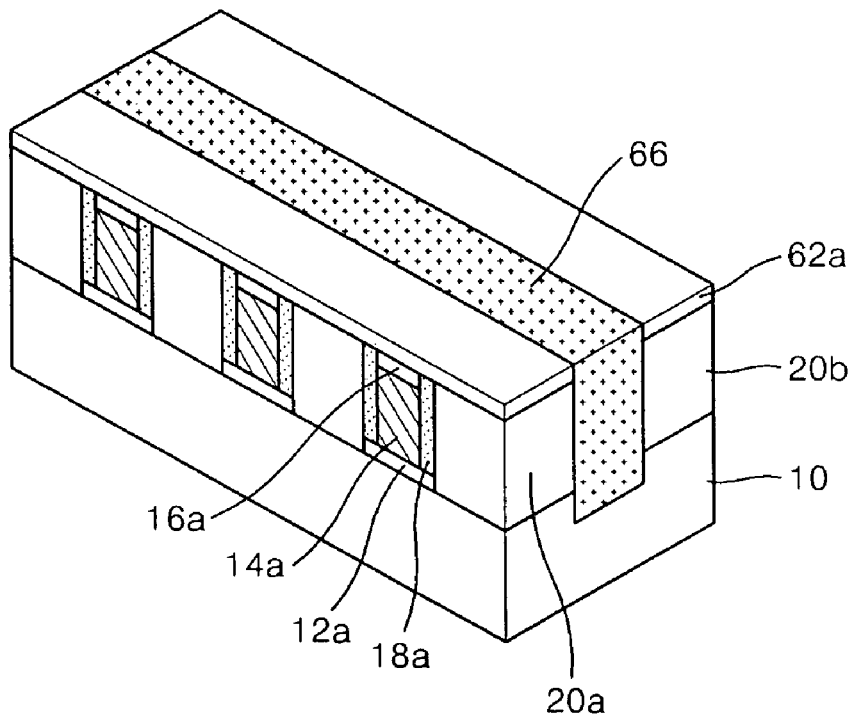
Figure 21:
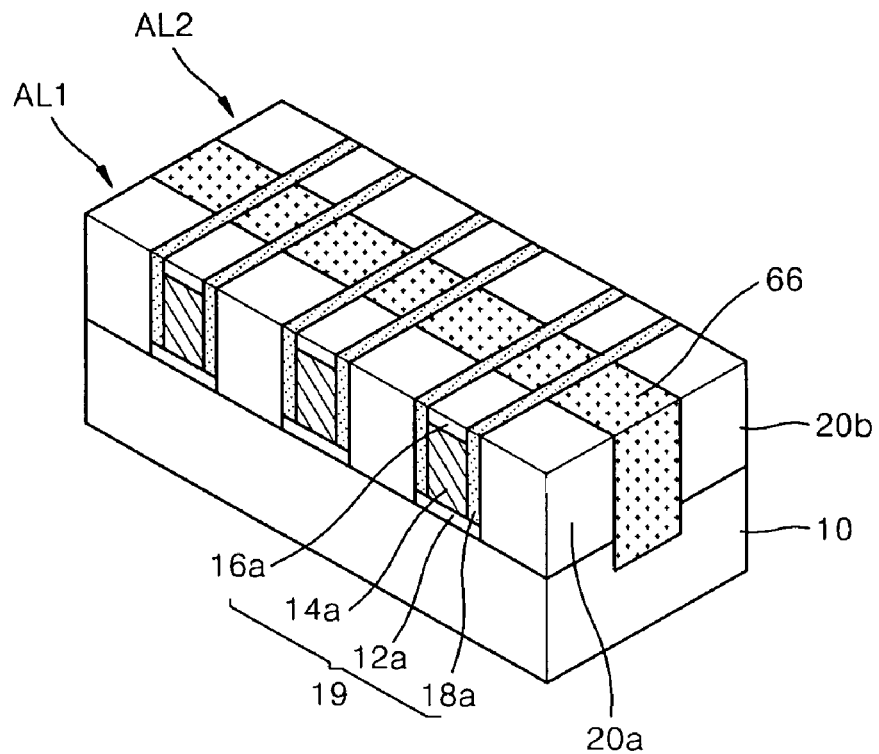
Figure 22:
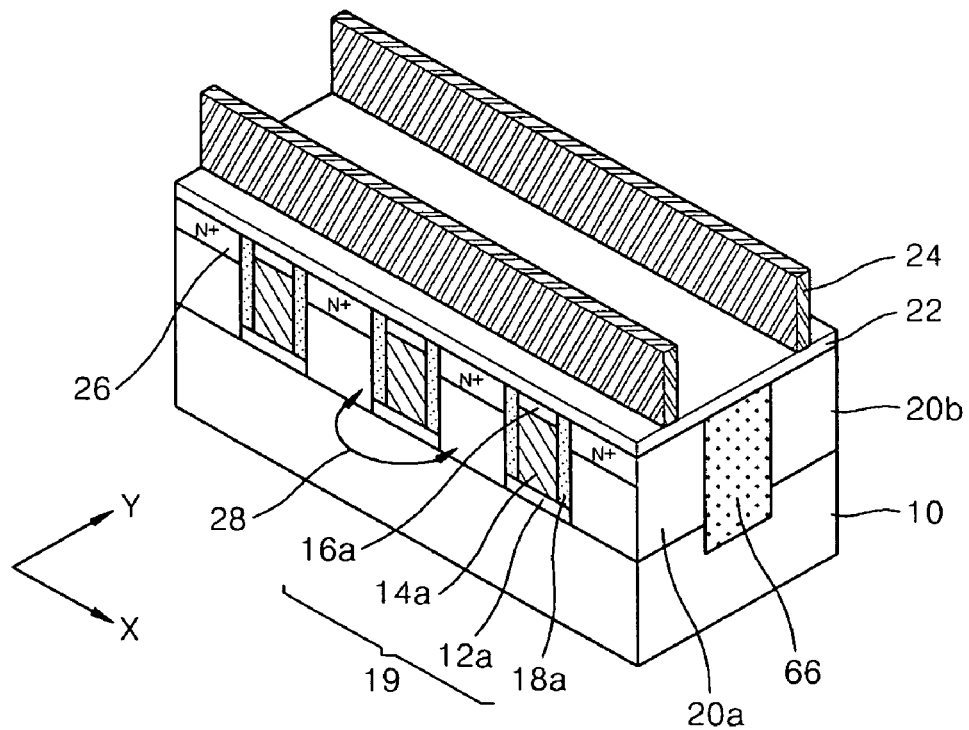
Figure 23:
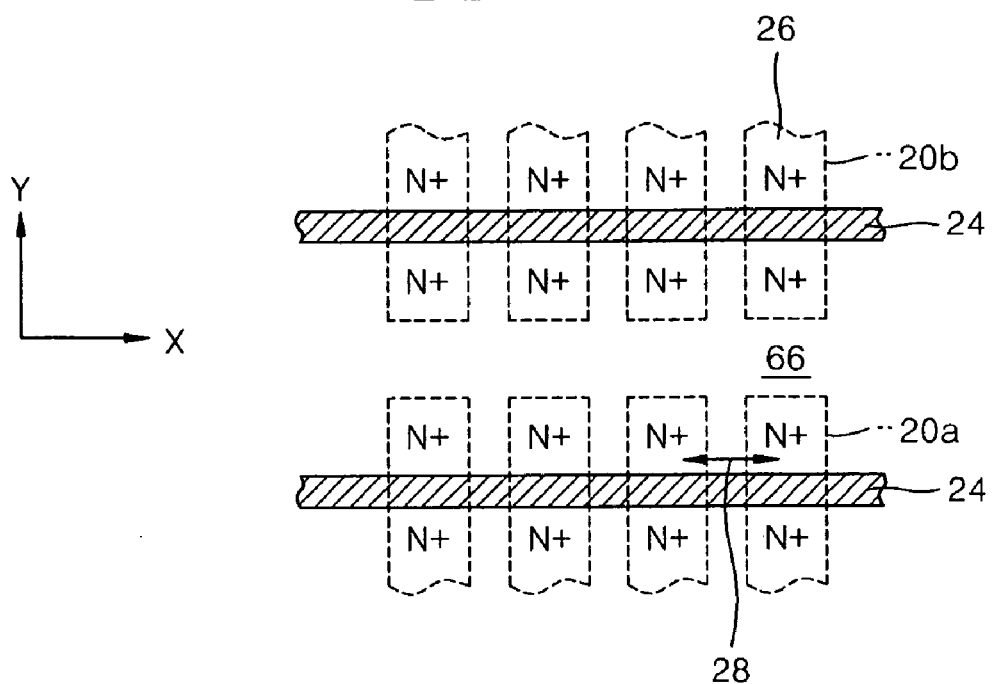

FIGS. 17-22 are perspective views for illustrating a method of manufacturing a semiconductor device including an isolation process, according to example embodiments and FIG. 23 is a partially enlarged plane view of FIG. 22. The method of manufacturing a semiconductor device according to FIGS. 17-22 may be the same as that of FIGS. 1-7 in terms of structure and function of the produced semiconductor device, except for forming holes to isolate the active patterns 20 and forming second isolation patterns in the holes. The method of manufacturing a semiconductor device according to FIGS. 17-22 may be described with reference to that of FIGS. 1-7, however, may also be described with reference to that of FIGS. 9-16.

The method of manufacturing a semiconductor device according to FIGS. 17-22 may be carried out using the manufacture processes described in FIGS. 1-5 of example embodiments. Manufacture processes illustrated in FIGS. 17-23 may be carried out. In FIGS. 17-23, like reference numerals in FIGS. 1-7 denote like elements.

Figure 17:
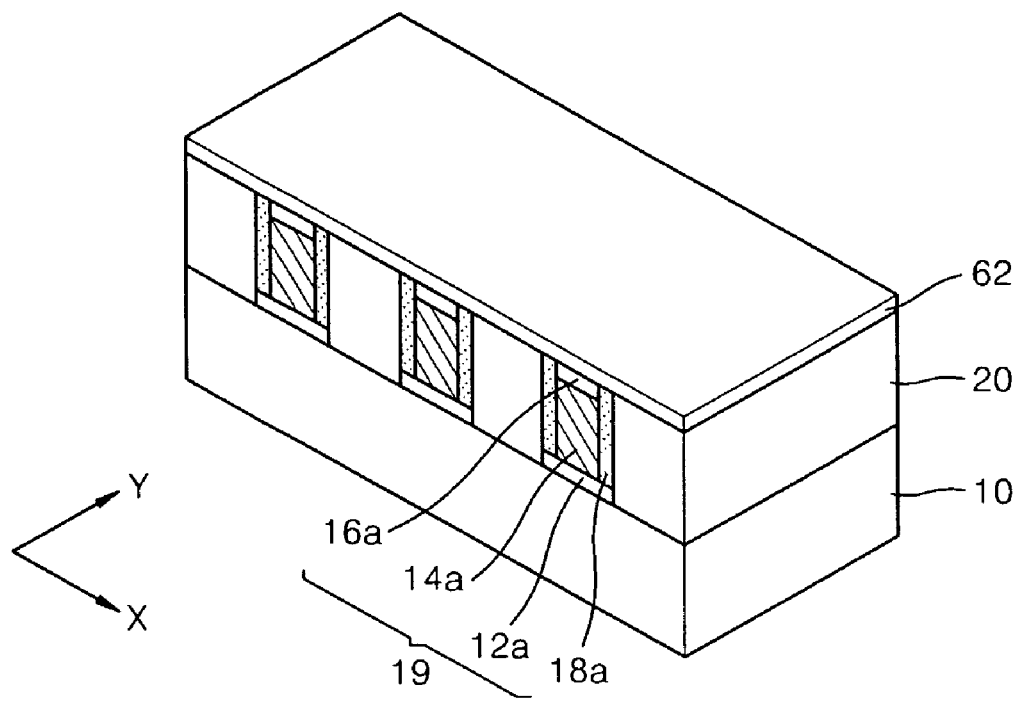
Figure 18:
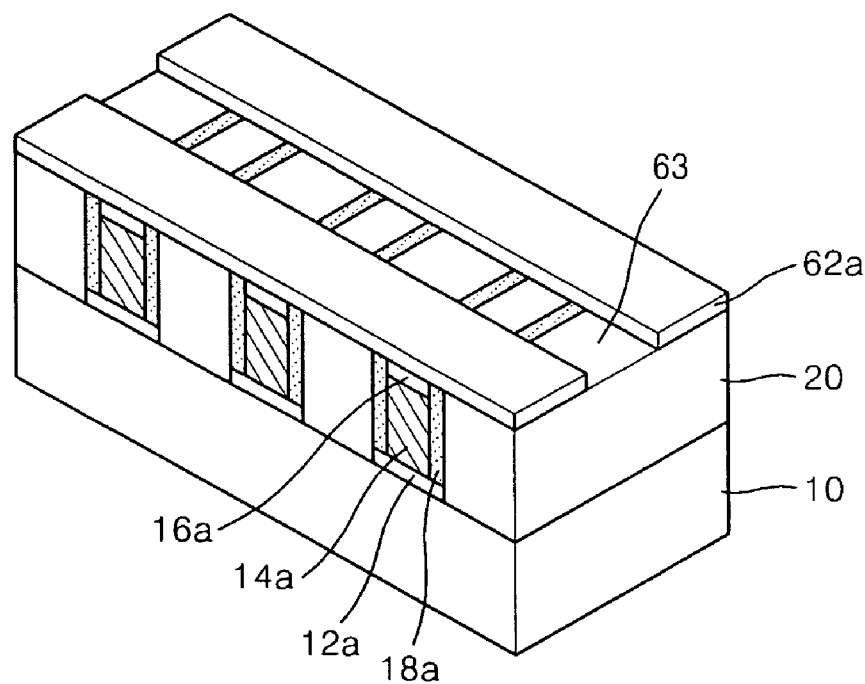

Referring to FIGS. 17 and 18, a mask layer 62 used in isolation may be formed on the isolation patterns 19 and the active patterns 20. The mask layer 62 may be formed of an oxidization layer. The mask layer 62 may be patterned using a photo etching process so as to form a plurality of mask patterns 62a. The mask patterns 62a may be in the Y-axis direction and exposing portion 63, which exposes the surfaces of the active patterns 20, may be formed between the mask patterns 62a. One of the mask patterns 62a may extend in the X-axis direction.

Figure 19:
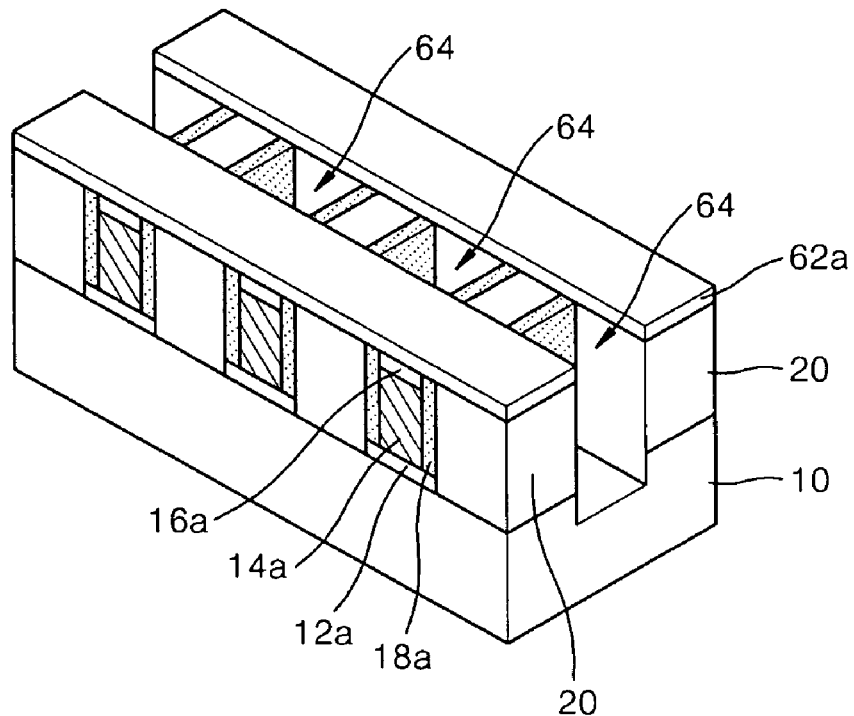

Referring to FIGS. 19 and 20, the active patterns 20 may be etched using the mask patterns 62a as a mask so as to form a plurality of the holes 64 to isolate the active patterns 20 in the Y-axis direction. The holes 64 may be formed to be deep so that the bottoms of the holes 64 may be formed in the semiconductor substrate 10. The holes 64 may be formed to extend in the X-axis direction. In example embodiments, all holes 64 may be formed in the active patterns 20 and may be formed in any one of the active patterns 20. The second isolation patterns 66, which fill the holes 64, may be formed, the holes 64 isolating the active patterns 20. The active patterns 20 may be divided into first active patterns 20a and second active patterns 20b depending on their position with respect to the second isolation patterns 66.

Referring to FIGS. 21, 22, and 23, the mask patterns 62a and the second isolation patterns 66 may be etched back to expose the surfaces of the first and second active patterns 20a and 20b. The first and second active patterns 20a and 20b extend in a line in the X-axis direction. In example embodiments, the first and second active patterns 20a and 20b may be classified into a first active line AL1 and a second active line A2 based around the second isolation patterns 66.

As in FIGS. 1-7, the gate insulation layer 22, the gate patterns 24, and the source/drain regions 26 may be formed on the isolation patterns 19 and 66 and the front surfaces of the first and second active patterns 20a and 20b. The semiconductor device according to FIGS. 17-22 may apply bias to the conductive patterns 14a as in FIGS. 1-7. Accordingly, electricity may be prevented or reduced from flowing between the unit cells in the X-axis direction, e.g., a channel width direction, as marked with reference numeral 28, and thus, isolation properties may be improved.

Figure 26:
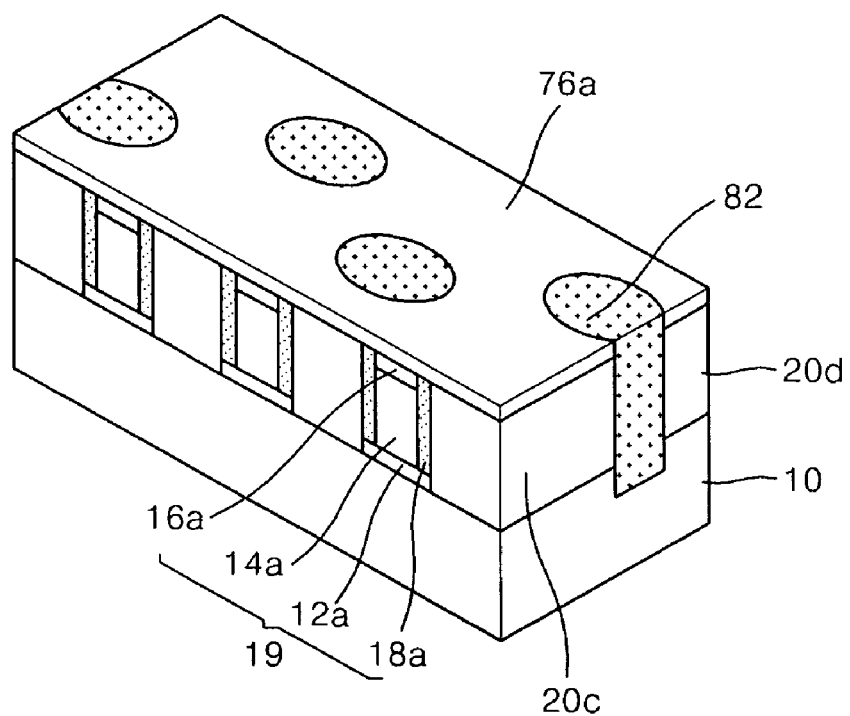
Figure 27:
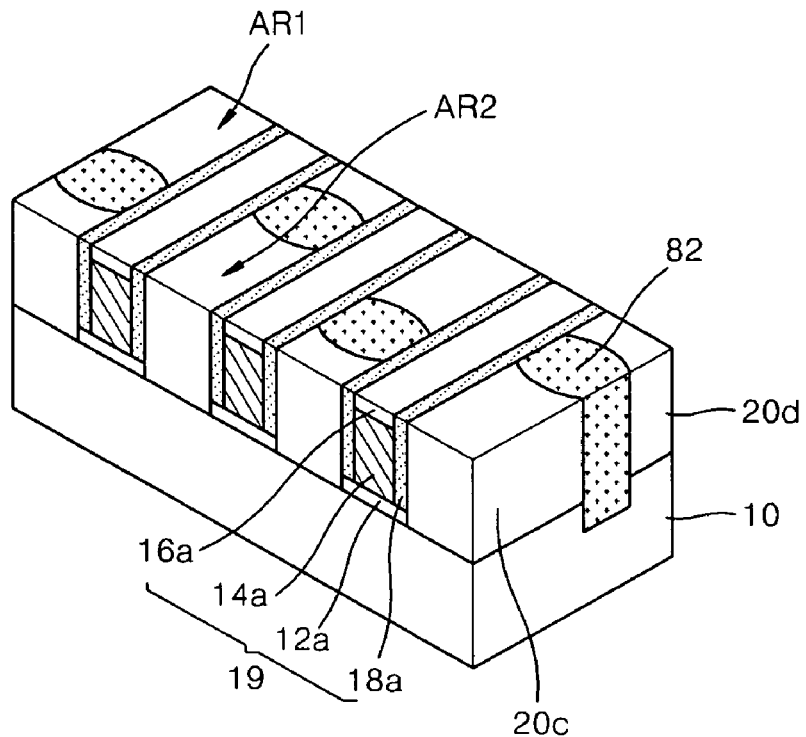
Figure 28:
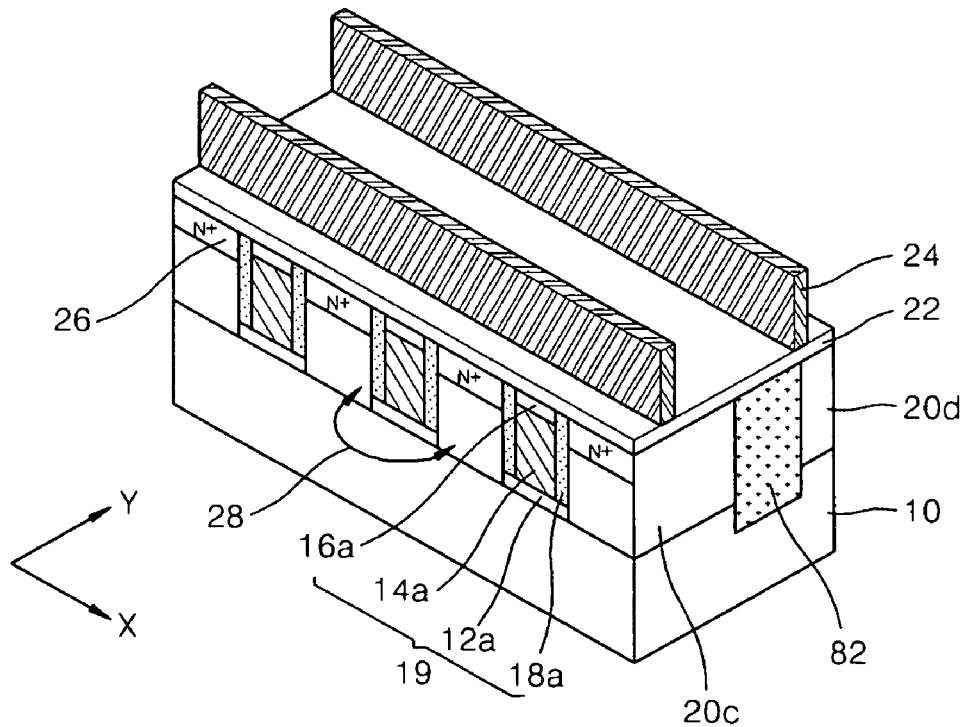
Figure 29:
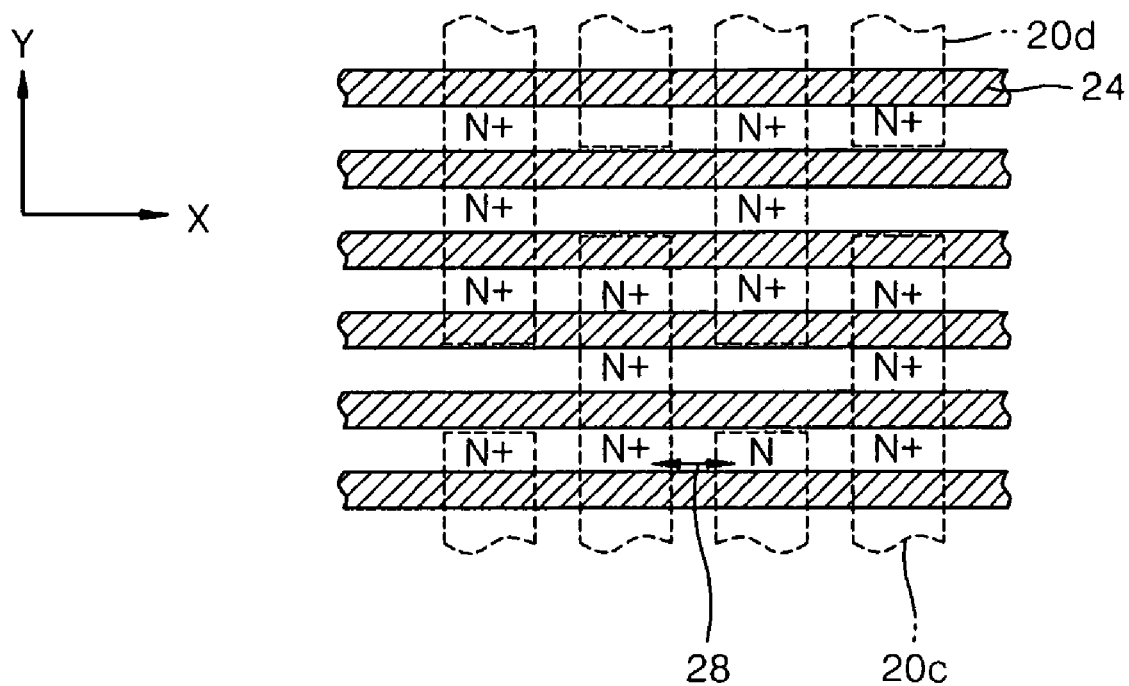

FIGS. 24-28 are perspective views for illustrating a method of manufacturing a semiconductor device including an isolation process, according to example embodiments and FIG. 29 may be partially enlarged plane view of FIG. 28. The method of manufacturing a semiconductor device according to FIGS. 24-28 may be the same as that of FIGS. 1-7 in terms of the structure and the function, except for forming holes to isolate the active patterns 20 and forming second isolation patterns in the holes. The method of manufacturing a semiconductor device according to FIGS. 24-28 may be described with reference to that of FIG. 1-7, however, may also be described with reference to that of FIGS. 9-16. The method of manufacturing a semiconductor device according to FIGS. 24-28 may be the same as that of FIGS. 17-22, in terms of the structure and the function of a produced semiconductor device, except in forming the holes to isolate the active patterns 20, the holes may be formed freely instead of being uniformly formed.

Figure 24:
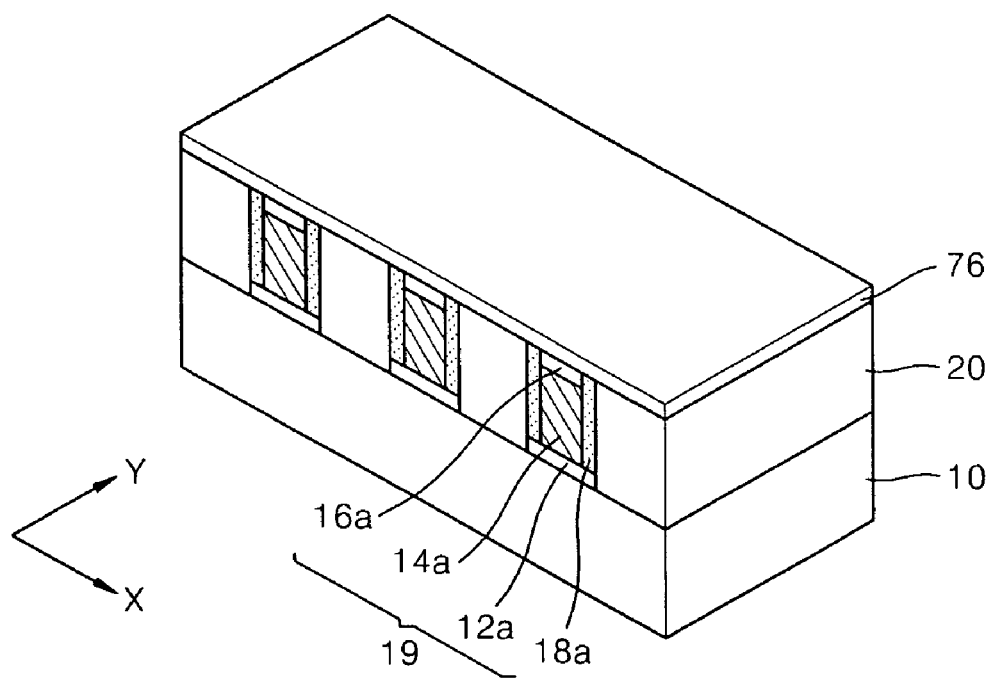
Figure 25:
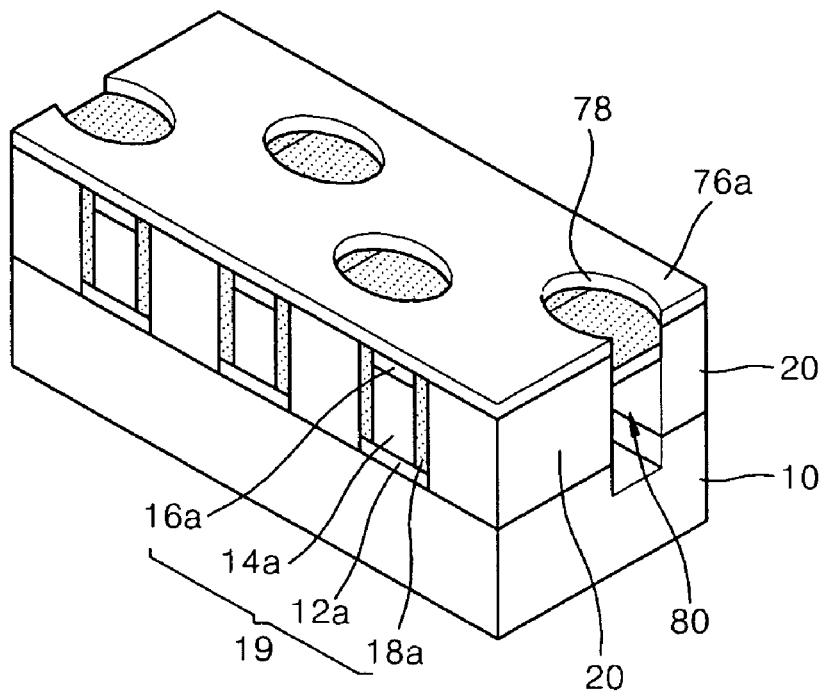

The method of manufacturing a semiconductor device according to FIGS. 24-28 may be carried out using the manufacture processes described in FIGS. 1-5. Manufacture processes illustrated in FIGS. 24-28 may be carried out. In FIGS. 24-28, like reference numerals in FIGS. 1-7 denote like elements. Referring to FIGS. 24-25, a mask layer 76 used in isolation may be formed on the isolation patterns 19 and the active patterns 20. The mask layer 76 may be formed of an oxidization layer. The mask layer 76 may be patterned using a photo etching process so as to form a mask pattern 76a having a plurality of exposing units 78 to expose the active patterns 20. The exposing units 78 may be formed freely on the active patterns 20.

The active patterns 20 may be etched using the mask pattern 76a having the exposing units 78 as a mask so as to form a plurality of holes 80 to isolate the active patterns 20 in the Y-axis direction. The holes 80 may be formed to be deep so that the bottoms of the holes 80 may be formed in the semiconductor substrate 10. Accordingly, the isolation property may increase in the Y-axis direction. The holes 80 may be formed freely, instead of being arranged in the X-axis direction. In example embodiments, all holes 80 may be formed in the active patterns 20 and may be formed in any one of the active patterns 20.

Referring to FIG. 26, the second isolation patterns 82, which fill the holes 80, may be formed. The holes 80 may isolate the active patterns 20. According to the second isolation patterns 82, the active patterns 20 may be divided into first active patterns 20c and second active patterns 20d in the Y-axis direction. Referring to FIGS. 27, 28, and 29, the mask pattern 76a and the second isolation patterns 82 may be etched back to expose the surfaces of the first and second active patterns 20c and 20d. The first and second active patterns 20c and 20d may be formed freely in a first active region AR1 and a second active region AR2.

Similar to FIGS. 1-7, the gate insulation layer 22, the gate patterns 24, and the source/drain regions 26 may be formed on the isolation patterns 19 and 82 and the front surfaces of the first and second active patterns 20a and 20b. The semiconductor device according to FIGS. 24-28 may apply bias to the conductive patterns 14a as in FIGS. 1-7. Accordingly, electricity may be prevented or reduced from flowing between the unit cells in the X-axis direction, e.g., a channel width direction, as marked with reference numeral 28, and thus, isolation properties may be improved.

In the method of manufacturing a semiconductor device according to example embodiments, the isolation patterns including the conductive patterns may be formed on the semiconductor substrate and the active patterns which fill gaps between the isolation patterns may be formed. Accordingly, isolation patterns may easily be formed, without using a trench process, for example, a process of filling the trench. Also, bias may be applied to the conductive patterns included in the isolation patterns so that the depth of the isolation patterns may be reduced and isolation properties of the isolation pattern may be improved. The isolation patterns may be formed using self-aligned double patterning, and thus, the semiconductor device may be highly integrated.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of manufacturing a semiconductor device, the method comprising:

forming a plurality of isolation patterns including conductive patterns on a semiconductor substrate, and forming gaps between the isolation patterns;
forming active patterns filling the gaps on the semiconductor substrate;
forming a gate insulation layer on the isolation patterns and the active patterns; and
forming gate patterns on the gate insulation layer.

2. The method of claim 1, wherein forming the plurality of isolation patterns includes:
forming first insulation patterns on the semiconductor substrate;
forming the conductive patterns on the first insulation patterns; and
forming second insulation patterns on both sidewalls of the conductive patterns.

3. The method of claim 2, wherein the conductive patterns are surrounded by the first insulation patterns, the second insulation patterns, and the gate insulation layer.

4. The method of claim 1, wherein forming the plurality of isolation patterns includes:
forming a first insulation layer on the semiconductor substrate;
forming the conductive patterns on the first insulation layer;
forming the gaps between the conductive patterns;
forming a second insulation layer on the semiconductor substrate and the gaps to surround the conductive patterns;
forming first insulation patterns and the conductive patterns on the semiconductor substrate; and
forming second insulation patterns on both sidewalls of the conductive patterns by etching the second insulation layer and the first insulation layer.

5. The method of claim 4, wherein etching the second insulation layer and the first insulation layer includes etching back the second insulation layer and the first insulation layer to expose the surfaces of the conductive patterns and the semiconductor substrate.

6. The method of claim 1, wherein forming the plurality of isolation patterns includes:
forming a first insulation layer on the semiconductor substrate;
forming a plurality of first conductive patterns on the first insulation layer;
forming a plurality of second conductive patterns between the plurality of first conductive patterns;
forming second insulation patterns between the plurality of first conductive patterns and the plurality of second conductive patterns;
forming first insulation patterns and the plurality of first or second conductive patterns on the semiconductor substrate by etching the second insulation patterns and the first insulation layer;
forming a second insulation layer on the semiconductor substrate to surround the plurality of first conductive patterns and the plurality of second conductive patterns;
forming the first insulation patterns and the plurality of first and second conductive patterns on the semiconductor substrate; and
forming second insulation patterns on both sidewalls of the plurality of first and second conductive patterns by etching the third insulation layer.

7. The method of claim 6, wherein forming the first insulation patterns and the second insulation patterns includes etching back the second insulation layer so as to expose the surfaces of the first conductive patterns and the semiconductor substrate.

8. The method of claim 6, wherein forming the plurality of first conductive patterns, the plurality of second conductive patterns, and the second insulation patterns includes:
forming a third insulation layer on the semiconductor substrate to surround the plurality of first conductive patterns;
forming a plurality of third insulation patterns on both sidewalls of the first conductive patterns by etching back the third insulation layer so as to expose the surfaces of the first conductive patterns;
forming a second conductive layer on the first insulation layer filling gaps between the third insulation patterns; and
forming the third insulation patterns by etching back the second conductive layer so as to expose the surfaces of the first conductive patterns and the third insulation patterns.

9. The method of claim 1, further comprising: isolating the active patterns by forming holes; and
forming second isolation patterns in the holes to insulate the active patterns.

10. The method of claim 9, wherein the active patterns are arranged in a line or freely arranged according to the arrangements of the holes and the second isolation patterns.

11. The method of claim 1, wherein the active patterns fill the gaps using a selective epitaxial growth process.

12. The method of claim 1, wherein the conductive patterns are formed of at least one of a poly silicon layer doped with impurities, a titanium nitride (TiN) layer, and a tungsten (W) layer and the active patterns are formed of a silicon layer.

13. The method of claim 1, wherein forming the plurality of isolation patterns includes forming the conductive patterns and insulation patterns in one direction, the conductive patterns applying bias to the semiconductor substrate and the insulation patterns surrounding and isolating the conductive patterns, and the gate patterns are formed in another direction perpendicular to the one direction on the gate insulation layer, and further comprising:
forming source/drain regions on the active patterns in the other direction.

14. The method of claim 13, wherein the one direction is a direction of a channel width and the other direction is a direction of a channel length.

15. The method of claim 13, wherein forming the insulation patterns includes forming first insulation patterns on the semiconductor substrate and second insulation patterns on both sidewalls of the conductive patterns.

16. The method of claim 13, further comprising:
isolating the active patterns in the other direction by forming holes; and
forming second isolation patterns in the holes to insulate the active patterns.

17. The method of claim 16, wherein the holes isolating the active patterns in the other direction are formed to extend in the one direction so that the active patterns are arranged in a line.

18. The method of claim 16, wherein the holes isolating the active patterns in the other direction are formed to be freely arranged in the active patterns.

19. The method of claim 1, before forming the plurality of isolation patterns, further comprising:
forming a first insulation layer on the semiconductor substrate;

forming a plurality of conductive patterns capable of applying bias to the first insulation layer in one direction and forming gaps between the conductive patterns;

forming a second insulation layer on the first insulation layer and in the gaps to surround the conductive patterns, wherein forming the plurality of isolation patterns on the semiconductor substrate includes forming first insulation patterns, the plurality of conductive patterns and second insulation patterns on both sidewalls of the plurality of conductive patterns by etching the first and second insulation layers, and wherein forming the gate patterns on the gate insulation layer includes forming gate patterns in another direction perpendicular to the one direction.

20. The method of claim 19, further comprising:

forming source/drain regions on the active patterns on both sides of lower portions of the gate patterns in the other direction, wherein the conductive patterns are formed of materials having high etching selectivity, compared with those of the first and second insulation layers.

* * * * *